United States Patent [19]

Muramoto

[11] Patent Number: 4,884,113

[45] Date of Patent: Nov. 28, 1989

[54] DOUBLE-DIFFUSED, INSULATED-GATE, FIELD EFFECT TRANSISTOR

[75] Inventor: Ken'ichi Muramoto, Hyogo, Japan

[73] Assignee: Kabushiki Kaisha Toshiba, Kawasaki, Japan

[21] Appl. No.: 188,070

[22] Filed: Apr. 28, 1988

[30] Foreign Application Priority Data

Dec. 25, 1984 [JP] Japan .............................. 59-278432

[51] Int. Cl.$^4$ .................... H01L 29/78; H01L 29/90
[52] U.S. Cl. ................................ 357/23.4; 357/23.8; 357/13
[58] Field of Search .................. 357/23.8, 23.4, 13

[56] References Cited

U.S. PATENT DOCUMENTS

| 4,233,617 | 11/1980 | Klaassen et al. | 357/23.4 |
| 4,300,150 | 11/1981 | Colak | 357/23.8 |
| 4,376,286 | 3/1983 | Lidow et al. | 357/23.8 |

FOREIGN PATENT DOCUMENTS 0118921 9/1984 European Pat. Off. ........... 357/23.8

57-109376 7/1982 Japan ................................. 357/23.8

*Primary Examiner*—Andrew J. James
*Assistant Examiner*—Jerome Jackson, Jr.
*Attorney, Agent, or Firm*—Finnegan, Henderson Farabow, Garrett and Dunner

[57] ABSTRACT

A double-diffused insulated-gate field effect transistor is disclosed having impurity regions each acting as a channel base region and depletion layer preventing regions having a high concentration impurity and being of a conductivity type opposite to that of the base region. With the transistor in the ON state a depletion layer is confined within the depletion layer preventing region, preventing an increase in ON resistance in a narrow region between the channel base regions. The concentration and diffusion depth of the depletion layer preventing region are such that, due to the presence of the depletion layer preventing region, the reverse bias voltage between the channel base region and a drain region causes no avalanche breakdown between the channel base region and the drain region.

3 Claims, 4 Drawing Sheets

DOUBLE-DIFFUSED, INSULATED-GATE, FIELD EFFECT TRANSISTOR

This application is a continuation of application Ser. No. 808,252, filed Dec. 12, 1985 now abandoned.

BACKGROUND OF THE INVENTION

1. Field of the Invention

The present invention relates to a double-diffused, insulated-gate, field effect transistor.

2. Description of the Prior Art

FIGS. 1(A) and 1(B) show a known double-diffused, insulated-gate, field effect transistor. As shown in these figures, the transistor comprises a semiconductor substrate consisting of N+ semiconductor layer 1a and N− semiconductor layer 1b formed on the layer 1a. Layer 1b acts as a drain region. Channel base regions 2 of the P conductivity type are formed in layer 1b, spaced apart from each other. Narrow region 3, generally called a neck area, is provided between regions 2. Source electrode 5 is buried in insulating layer 4 overlying channel base regions 2. Gate electrode 6 is formed in insulating layer 4 and overlies region 3.

Let us assume that a power MOSFET having a high reverse bias voltage of hundreds of volts (e.g., 400 V) of the structure described above is manufactured. The conduction path 100 of this power MOSFET is prominently narrowed due to the broadening of a depletion layer formed in narrow region 3. This increases the ON resistance of the power MOSFET. Hence, the magnitude of the ON current of the MOSFET is about ten times lower than that of a power MOSFET having a lower reverse bias voltage of, for example, 60 V, provided the narrow regions of the power MOSFET are of equal size. One solution of this problem is to broaden region 3. This solution results in a decrease of effective channel width per unit area. This decrease does not occur in the MOSFET shown in FIG. 2, wherein N+ impurity area 8 having the same diffusion depth as channel base regions 2 is formed in narrow region 9 present between regions 2.

The MOSFET of FIG. 2 has a drawback, however. Since entire region 8 is an N+ type region, the source-to-drain reverse bias voltage, $V_{DSS}$, is determined by channel base regions 2 and N+ impurity area 8. Hence, the MOSFET cannot have a high reverse bias voltage. To raise the reverse bias voltage, depletion layer 7 must be formed below narrow region 3, thus floating the potential of impurity area 8. This method improves the ON characteristic of the MOSFET, as experimentally proved, but narrow area 9 is left between depletion layer 7, immediately below N+ region 8.

Hitherto it has been possible to solve the above-noted problem completely.

SUMMARY OF THE INVENTION

Accordingly, the object of this invention is to provide a double-diffused, insulated-gate, field effect transistor which has an improved ON-resistance characteristic and a high reverse bias voltage.

According to this invention, there is provided a double-diffused, insulated-gate, field effect transistor comprising a semiconductor substrate of a first conductivity type, two impurity regions of a second conductivity type formed, at a predetermined interval, in the semiconductor substrate, high concentration impurity regions of the first conductivity type formed in predetermined region of each impurity region of the second conductivity type, and depletion layer preventing regions each formed along an interface between each impurity region of the second conductivity type and the semiconductor substrate and having a high impurity concentration.

DETAILED DESCRIPTION OF THE PREFERRED EMBODIMENT

A transistor according to one embodiment of this invention will be explained by referring to FIG. 3.

Figure 1A:
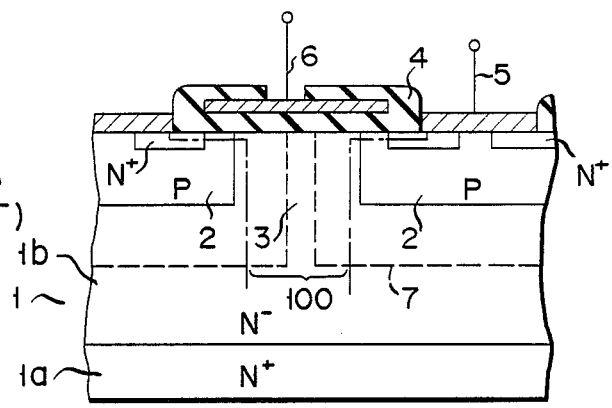
FIGS. 1(A) and 1(B) are a cross-sectional view and a plan view of a conventional MOSFET respectively.
Figure 1B:
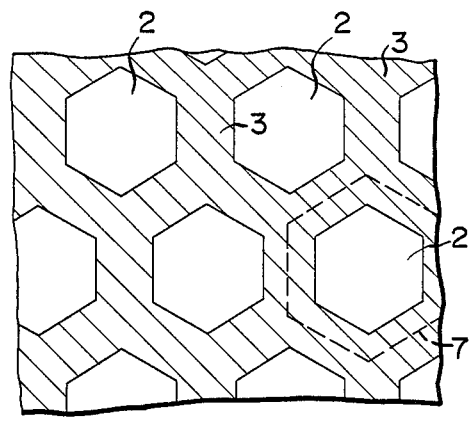
Figure 2:
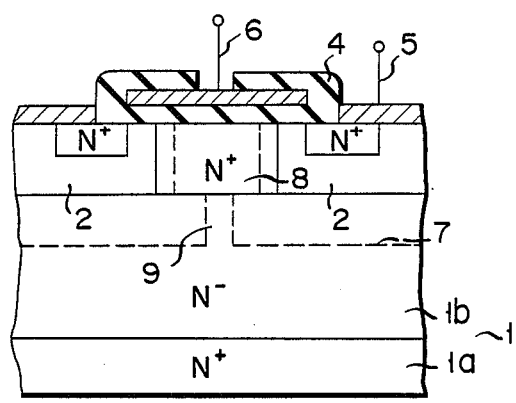
FIG. 2 is a cross-sectional view of another conventional MOSFET structure.
Figure 3:
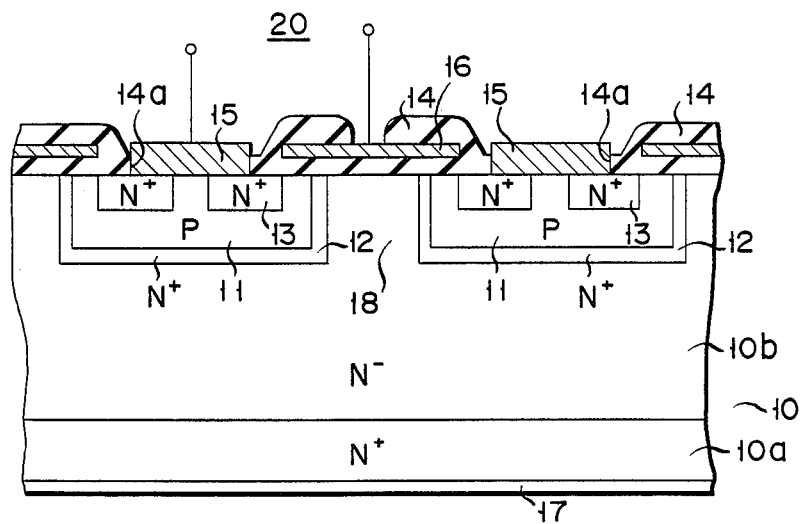
FIG. 3 is a cross-sectional view showing a MOSFET structure according to an embodiment of this invention.

As shown in FIG. 3, a semiconductor substrate 10 is comprised of N+ semiconductor layer 10a, and N− semiconductor layer 10b formed on the semiconductor layer 10a and serving as a drain region. Impurity regions 11 of the P conductivity type are formed, at a predetermined interval, in N− semiconductor layer 10b and serve as channel base regions. Depletion layer preventing regions 12 are formed at an interface between impurity regions 11, on the one hand, and N− semiconductor layer 10b, on the other. These regions are comprised of an N+ conductivity type impurity layer of a high impurity concentration. N+ conductivity type impurity regions 13 of a high impurity concentration, serving as source regions, are formed, at predetermined intervals, in each impurity region 11, respectively. Insulating layer 14 is formed on the N− semiconductor layer. Source electrode 15 is formed, extending through contact hole 14a cut in the insulating layer 14, and connected to impurity region 13. Gate electrode 16 is buried in the insulating layer 14 overlying the impurity regions 11. Drain electrode 17 is formed on the N+ semiconductor layer 10a. Impurity region 13, impurity region 11, depletion layer preventing region 12 and N− semiconductor layer 10b have different impurity concentrations decreasing in that order.

Figure 4:
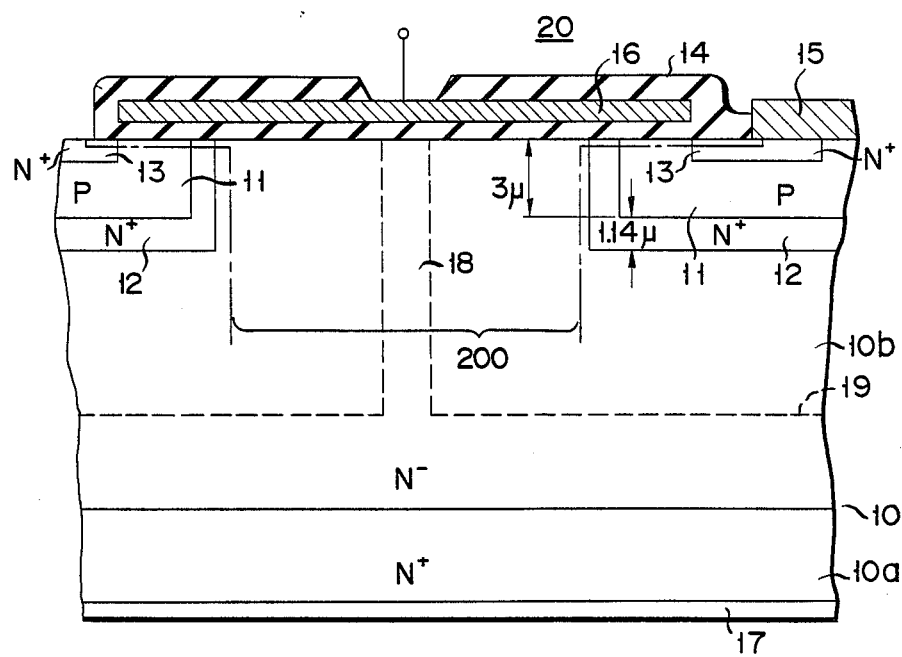
FIG. 4 explains the operation of a transistor of FIG. 3.

The source-to-drain current of a transistor 20 so formed will be explained in connection with the broadening of the depletion layer at the gate ON time ($V_{DS(ON)}$) and gate OFF time ($V_{DSS}$), while referring to an enlarged view of the major transistor portions as shown in FIG. 4. For ease in explanation, assume that the impurity concentration profile of N− semiconductor layer 10b, depletion layer preventing region 12 and impurity region 13 are stepped, and that the layers have the concentration levels and resistivities shown in the following table.

|  | impurity concentration | resistivity |
| --- | --- | --- |
| N⁻ semiconductor layer 10b | $2 \times 10^{14}$ cm$^{-3}$ | 24 Ω·cm |
| depletion layer preventing area | $1 \times 10^{16}$ cm$^{-3}$ | 0.5 Ω·cm |

With transistor 20 put in the ON state at the source-to-drain voltage $V_{DS(ON)} = 10$ V, the extending of the depletion layer toward the depletion layer preventing region 12 is evaluated. If the impurity concentration of impurity region 11 provides an adequately high step junction to depletion layer preventing region 12, most of the depletion layer extends toward depletion layer preventing region 12 only, as given by:

$$W = \sqrt{\frac{2K_s \epsilon_o V_{DS}}{qN_{D(N+)}}} \quad (1)$$

where
KS: a constant
q: an electric charge
$\epsilon_o$: a dielectric constant of a vacuum
$V_{DS}$: the source-to-drain voltage
$N_D$: the impurity concentration level of region 12.

Substituting the respective values into Equation (1) gives:

$$W_1 = \sqrt{\frac{2 \times 11.7 \times 8.86 \times 10^{-14} \times 10}{1.6 \times 10^{-19} \times 1 \times 10^{16}}} = 1.14 \times 10^{-4} \text{ [cm]} \quad (2)$$

Figure 5A:
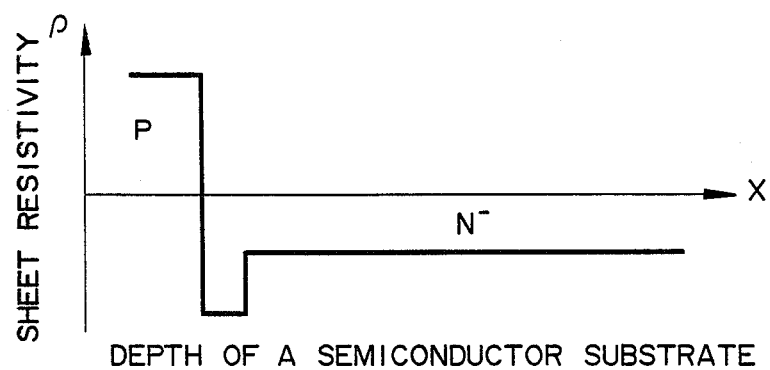
FIG. 5(A) shows the impurity concentration profile on a junction of the transistor of FIG. 3.
Figure 5B:
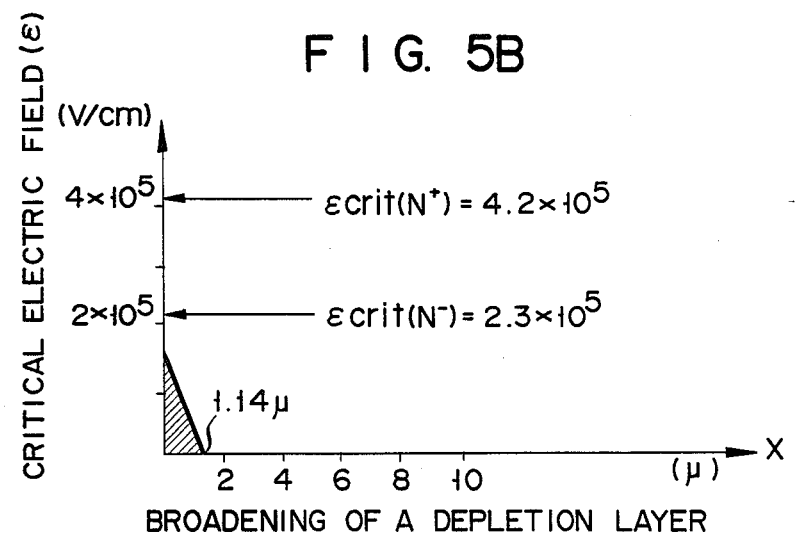
FIG. 5(B) shows the relationship between a critical electric field and the broadening of a depletion layer for the transistor of FIG. 3.

From this it will be understood that the depletion layer extends about 1.14μ toward depletion layer preventing region 12. In this case, the junction concentration distribution (sheet resistivity) is as shown in FIG. 5(A) and the distribution of the electric field is as shown in FIG. 5(B). Hence the width of region 12 is set to the order of 1.4μ.

In the absence of any depletion layer preventing region around impurity layer 13, the broadening of the depletion layer will be given by:

$$W_2 = \sqrt{\frac{2 \times 11.7 \times 8.86 \times 10^{-14} \times 10}{1.6 \times 10^{-19} \times 2 \times 10^{14}}} = 8 \times 10^{-4} \text{ [cm]} \quad (3)$$

where $N_D$ (N+) is replaced by $N_D$ (N−).

Obviously, in the absence of the depletion layer preventing region, the depletion layer is broadened to an extent about 7 times as much as in the presence of a depletion layer preventing region. In FIG. 4, the broken line shows the broadening of depletion layer 19 achieved in the absence of region 12. In this case, a conduction path 200 of a narrow region 18, which is formed between impurity regions 11 and 11, is narrowed, resulting in an increase of ON resistance.

Figure 6:
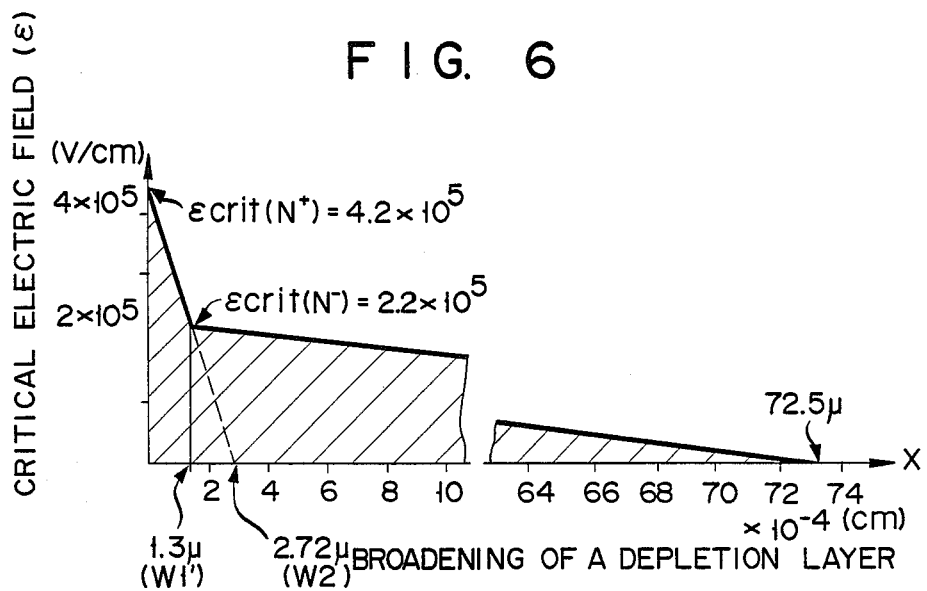
FIG. 6 shows the relationship between a critical electric field and the broadening of a depletion layer for the transistor of FIG. 3.
Figure 7:
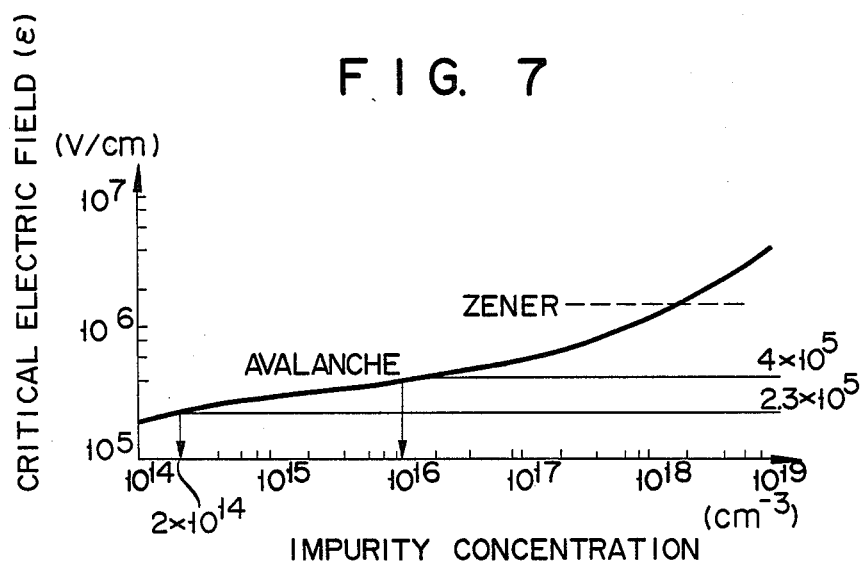
FIG. 7 explains the relationship between a critical electric field and an impurity concentration level for the transistor of FIG. 3.

The determination of a breakdown voltage ($V_{DSS}$) at the OFF time of transistor 20 will now be explained. FIG. 6 shows an electric field distribution at the breakdown time. FIG. 7 shows the relationship between the intensity of the critical electric field and the impurity concentration which is important for evaluation. The breakdown voltage (BV) of the step junction will be expressed as follows:

$$BV = \frac{K_s \epsilon_0 E^2_{crit}}{2qN_D} \quad (4)$$

Using Equation (4) with respect to the impurity region 11 and region 12, we obtain:

$$BV_{(P-N+)} = \frac{11.7 \times 8.86 \times 10^{-14} \times (4.2 \times 10^5)^2}{2 \times 1.6 \times 10^{-19} \times 1 \times 10^{16}} = 57 \text{ [V]} \quad (5)$$

This indicates the breakdown voltage (BV) when the depletion layer was broadened a necessary amount toward depletion layer preventing region 12. At this time, the distance, over which the depletion layer was broadened, is given below, using Equation (1):

$$W_2 = \sqrt{\frac{2 \times 11.7 \times 8.86 \times 10^{14} \times 57}{1.6 \times 10^{-19} \times 1 \times 10^{16}}} = 2.72 \times 10^{-14} \text{ [cm]} \quad (6)$$

According to this invention, the width of the depletion layer preventing region 12 is set to exactly 1.14μ. This value is a minimal dimension, whereby with the transistor in the ON state at $V_{DS(ON)} = 10$ V, the depletion layer is suppressed. Since, however, it is insufficient in this case to completely set this value to a theoretical one, explanation will be given below with the width of region 12 ($W_1' = 1.3 \times 10^{-4}$ cm) being set to 1.3μ with an allowance of about 10%.

In the transistor 20 of this invention, N⁻ semiconductor layer 10b contacts depletion layer preventing region 12. In actual practice, the distribution of an electric field over the junction between region 12 and layer 10b varies as indicated by the solid line in FIG. 6. It is found that, unless the field strength at the point of change exceeds a critical electric field ($\epsilon_{crit(N-)}$), determined by the impurity concentration level of N⁻ semiconductor layer 10b, the avalanche breakdown is suppressed by the critical electric field ($\epsilon_{crit(N+)}$) determined by the impurity concentration level of the region 12.

In calculating the breakdown voltage ($V_{DSS}$) of the transistor in the OFF state, it is important to find the strength of the electric field ($\epsilon_{crit(N-)}$) at the changeover point of the inclination of the electric field distribution.

As evident from FIG. 6, the electric field strength on the changeover point is found from the following relation:

$$E'_{crit(N-)} = \frac{W_2 - W_1'}{W_2} \times E_{crit(N+)} \quad (7)$$

Substituting the respective associated values into Equation (7), we get:

$$E'_{crit(N-)} = \frac{(2.72 \times 10^{-4}) - (1.3 \times 10^{-4})}{2.72 \times 10^{-4}} \times 4.2 \times 10^5 \quad (8)$$
$$= 2.2 \times 10^5 \text{ [V/cm]}$$

Upon the calculation of the reverse bias voltage borne by the N⁻ semiconductor layer 10b by the use of $E_{crit(N-)}$, the following equation is obtained:

$$BV_{(N-)} = \frac{K_s \cdot \epsilon_o \cdot (E_{crit(N-)})^2}{2qN_{D(N-)}} \quad (9)$$

$$= \frac{11.7 \times 8.86 \times 10^{-14} \times (2.2 \times 10^5)^2}{2 \times 1.6 \times 10^{-19} \times 2 \times 10^{14}}$$

$$= 784 \text{ [V]}$$

On the other hand, the reverse bias voltage borne by depletion layer preventing region 12 can be expressed as follows:

$$BV_{(N+)} = \frac{[\epsilon_{crit(N+)} + E'_{crit2(N-)}] \times W_1}{2} \quad (10)$$

Substituting the respective values into Equation 10 gives:

$$BV_{(N+)} = \quad (11)$$

$$\frac{(4.2 \times 10^5 + 2.2 \times 10^5) \times 1.3 \times 10^{-4}}{2} = 42 \text{ [V]}$$

The total breakdown voltage, being a sum of $BV_{(N+)}$ and $_{(N-)}$, can be expressed as follows:

$$BV_{(N+, N-)} = BV_{(N+)} + BV_{(N-)} \quad (12)$$

$$= 42 + 784$$

$$= 826 \text{ [V]}$$

This value is determined to be the source-to-drain reverse bias voltage $V_{DSS}$. As appreciated from FIG. 7, $E_{crit(N-)}$ of the $N^-$ semiconductor layer 10b is $2.3 \times 10^5$ (V/cm).

However, the peak electric field $E_{crit(N-)}$ of the $N^-$ semiconductor layer merely attains $2.2 \times 10^5$ (V/cm) and, therefore, the depletion layer preventing region 12 first attains a critical electric field:

$$E_{crit(N+)} = 4.2 \times 10^5 \text{[V/cm]},$$

which value governs the breakdown phenomenon. It may not be said that an adequate theoretical breakdown value is attained from the impurity concentration of $N^-$ semiconductor layer 10b. Accordingly, any deviation from the theoretical breakdown value thus evaluated can be recognized from the above considerations. In the absence of the depletion layer preventing region 12, the breakdown voltage is given by:

$$BV_{(N-)} = \frac{K_s \cdot \epsilon_o (E_{crit(N-)})^2}{2qN_{D(N-)}} \quad (13)$$

$$= \frac{11.7 \times 8.86 \times 10^{-14} \times (2.3 \times 10^5)^2}{2 \times 1.6 \times 10^{-19} \times 1 \times 10^{14}}$$

$$= 857 \text{ [V]}$$

Thus, the deviation can be expressed by the following equation (14), noting that the reverse bias voltage is lowered by about 3.6%.

$$BV_{(N-)} - BV_{(N+,N-)} = 857 - 826 = 31\text{[V]} \quad (14)$$

A higher reverse bias voltage is attained according to this invention by making $E_{crit(N-)}$ as close to $\epsilon_{crit(N-)}$ as possible, making the concentration of depletion layer preventing region 12 as high as possible and making region 12 thinner. According to this invention, the impurity region 11 is formed by inverting region 12 by diffusing the P type impurity and, therefore, it is not possible to unduly increase the impurity concentration of region 12 with respect to the impurity concentration level of impurity region 11. Now suppose that region 12 is made extremely high in its concentration level and thinner in its width. In this case, the critical electric field $E_{crit}$, which governs the breakdown, is merely shifted from $E_{crit(N-)}$ to $E_{crit(N-)}$. This does not mean that the reverse bias voltage will be lowered.

The advantage of this invention will be explained with reference to the dimensions of the layer and region shown in FIG. 4.

The resistance per unit width of narrow region 18 provided between the impurity regions 11 of the transistor put in the ON state at $V_{DS}$ (drain voltage) of 10 V is given below:

$$R_{(N-)} = \frac{X_j(B) + W_1}{A_1 - 2W_1} \times \rho W \quad (15)$$

$$= \frac{3 \times 10^{-4} + 1.4 \times 10^{-4}}{1.8 \times 10^{-4} - 2 \times 1.14 \times 10^{-4}} \times 20$$

$$= 5.3 \text{ [}\Omega\text{/cm]}$$

In the absence of depletion layer preventing region 12, the following equation is obtained:

$$R'_{(N-)} = \frac{X_j(B) + W_2}{A_1 - 2W_2} \times \rho W \quad (16)$$

$$= \frac{3 \times 10^{-4} + 8 \times 10^{-4}}{1.8 \times 10^{-4} - 2 \times 8 \times 10^{-4}} \times 20$$

$$= 110 \text{ [}\Omega\text{/cm]}$$

Thus, a simple effect ratio $\alpha$ is:

$$\alpha = 110/5.3 \approx 20$$

Obviously, the current path resistance of narrow area 18 between the impurity regions 11 is improved by about 20-fold. Hence, the area of a power MOSFET to achieve a high reverse bias voltage ($V_{DSS} > 400$ V), which area has had to be greatly increased in the prior art, can now be extensively decreased.

Although in the above-mentioned embodiment explanation is given of a double-diffused insulated-gate FET of an N channel type, this invention can be applied to the P channel type.

What is claimed is:

1. A double-diffused insulated-gate field effect transistor comprising:

a semiconductor substrate of a first conductivity type, the semiconductor substrate forming a drain region;

two impurity regions of a second conductivity type formed at a predetermined interval, in the semiconductor substrate, said two impurity regions forming a channel base region;

first high concentration impurity regions of the first conductivity type formed in each of said two impurity regions of the second conductivity type, each said first high concentration impurity region forming a source region;

a plurality of second high concentration impurity regions of the first conductivity type each formed along an interface between each of said impurity regions of the second conductivity type and the semiconductor substrate to completely surround the channel base region, the concentration of each of the second high concentration impurity regions having a value at which a depletion layer formed at a junction between said second high concentration impurity region of the first conductivity type and said impurity region of the second conductivity type cannot extend beyond the respective second high concentration impurity region into the semiconductor substrate when a source-to-drain voltage is less than 10 volts; and an area of the semiconductor substrate formed between said plurality of second high concentration impurity regions.

2. The double-diffused insulated gate field effect transistor according to claim 1, wherein two depletion layers are formed, one depletion layer being formed at a junction defined between said second high concentration impurity region and one of the two impurity regions of the second conductivity type and another depletion layer being formed at a junction between another said second high concentration impurity region and the other of the two impurity regions so that the depletion layers extend beyond said two junctions into the semiconductor substrate.

3. A double-diffused insulated-gate field effect transistor according to claim 1, in which an impurity concentration and a diffusion depth of each of the impurity regions of the second conductivity type and each of the second high concentration impurity regions are so set that a first electrical field at which a reverse breakdown occurs between the respective one of the impurity regions of the second conductivity type and the respective one of the second high concentration impurity regions of the first conductivity type is substantially simultaneously attained with a second field at which the reverse breakdown occurs between the respective one of the impurity regions of the second conductivity type and the semiconductor substrate.

* * * * *

UNITED STATES PATENT AND TRADEMARK OFFICE
CERTIFICATE OF CORRECTION

PATENT NO. : 4,884,113

DATED : November 28, 1989

INVENTOR(S) : Ken'ichi Muramoto

It is certified that error appears in the above-identified patent and that said Letters Patent is hereby corrected as shown below:

On the Title Page, please insert --Continuation of Serial Number 808,252, December 12, 1985, abandoned.--

Signed and Sealed this

Twenty-sixth Day of May, 1992

Attest:

DOUGLAS B. COMER

*Attesting Officer*   Acting Commissioner of Patents and Trademarks